United States Patent
Mizukami et al.

[11] Patent Number: 6,045,862
[45] Date of Patent: Apr. 4, 2000

[54] CVD FILM FORMING METHOD IN WHICH A FILM FORMATION PREVENTING GAS IS SUPPLIED IN A DIRECTION FROM A REAR SURFACE OF AN OBJECT TO BE PROCESSED

[75] Inventors: Masami Mizukami; Takashi Mochizuki; Yumiko Kawano, all of Kofu, Japan

[73] Assignee: Tokyo Electron Limited, Tokyo, Japan

[21] Appl. No.: 09/112,452

[22] Filed: Jul. 9, 1998

[30] Foreign Application Priority Data

Jul. 16, 1997 [JP] Japan .................................. 9-205474

[51] Int. Cl.[7] .................................................. C23C 16/04
[52] U.S. Cl. .................................. 427/248.1; 427/255.23; 438/680
[58] Field of Search ........................... 427/248.1, 255.23; 438/680

[56] References Cited

U.S. PATENT DOCUMENTS 5,133,284  7/1992  Thomas et al. .......................... 118/719
5,326,725  7/1994  Sherstinsky et al. .................... 437/225
5,447,570  9/1995  Schmitz et al. ......................... 118/728

FOREIGN PATENT DOCUMENTS 5-190471  7/1993  Japan .

*Primary Examiner*—Timothy Meeks
*Attorney, Agent, or Firm*—Oblon, Spivak, McClelland, Maier & Neustadt, P.C.

[57] ABSTRACT

A CVD film forming apparatus includes a susceptor, provided in a process chamber, having a surface of an area smaller than that of a wafer. A process gas is supplied to a top surface of the wafer mounted on the susceptor, thereby forming a CVD film on the top surface. A film formation preventing gas is supplied in a direction from the rear surface of the wafer toward a peripheral edge thereof at a flow rate which prevents the process gas from flowing to the rear surface of the wafer.

5 Claims, 2 Drawing Sheets

CVD FILM FORMING METHOD IN WHICH A FILM FORMATION PREVENTING GAS IS SUPPLIED IN A DIRECTION FROM A REAR SURFACE OF AN OBJECT TO BE PROCESSED

BACKGROUND OF THE INVENTION

The present invention relates to a CVD film forming method and apparatus for forming a film or layer by CVD on an object to be processed, such as a semiconductor wafer.

In the process of manufacturing a semiconductor device, a metal or metallic compound film is formed on a semiconductor wafer made of, for example, silicon, by CVD (Chemical Vapor Deposition), so that an integrated circuits can be formed on the wafer. For example, an Al film is formed on the main surface of the semiconductor wafer as follows. First, the semiconductor wafer is placed on a susceptor with an electrostatic chuck in a process chamber. The susceptor has a ceramic base member in which a heating member is embedded. While the semiconductor wafer is being heated by electricity supplied to the heating member, a process gas, e.g., dimethylaluminumhydride (DMAH) is introduced at a predetermined flow rate into the process chamber through a shower head provided above the susceptor. As a result, an Al film is formed on the surface of the semiconductor wafer.

To form an Al film, an electrostatic chuck having a diameter slightly smaller than that of the semiconductor wafer is used. The semiconductor wafer is held on the susceptor such that the circumferential edge of the semiconductor wafer is slightly projected from the electrostatic chuck, thereby preventing film formation on the electrostatic chuck.

However, in this case, the process gas flows to the rear surface of the projected portion of the semiconductor wafer and a film is formed thereon. If a film is formed on the rear surface of the semiconductor wafer, the film may be removed during a transfer or other processes, resulting in particles.

BRIEF SUMMARY OF THE INVENTION

An object of the present invention is to provide a CVD film forming method and apparatus, for forming a film on a main surface of an object to be process, while effectively preventing a film from being formed on a rear surface of the object.

According to a first aspect of the present invention, there is provided a CVD film forming apparatus comprising:
 a process chamber;
 a susceptor, provided in the process chamber, having a surface of an area at least the substantially same as that of an object to be processed, the surface being entirely covered by a first surface of the object to be processed mounted on the susceptor;
 process gas supplying means for supplying a process gas to a second surface of the object to be processed mounted on the susceptor, thereby forming a film on the second surface; and
 film formation preventing gas supplying means for supplying film formation preventing gas in a direction from the first surface of the object to be processed toward a peripheral edge thereof at a flow rate which can prevent the process gas from flowing to the first surface of the object to be processed.

According to a second aspect of the present invention, there is provided a CVD film forming method, wherein an object to be processed is mounted on a susceptor provided in a process chamber and a process gas is supplied to a main surface of the object to be processed, thereby forming a film on the object to be processed, the method comprising a step of supplying film formation preventing gas in a direction from a rear surface of the object to be processed toward a peripheral edge thereof, the film formation preventing gas having a flow rate which prevents the process gas from flowing to the rear surface of the object to be processed at the peripheral edge of the object to be processed.

With the above apparatus and method, when the film formation preventing gas is supplied from the rear surface of the object to be processed toward the peripheral edge thereof, the flow rate of the gas is set to a value which can prevent the process gas from flowing to the rear surface of the object to be processed at the peripheral edge of the object. Therefore, film formation on the rear surface of the object by the process gas is prevented.

It is preferable that the surface of the susceptor has an area smaller than that of the object to be processed, so that the object to be processed is mounted on the susceptor so as to have a projected portion in a peripheral portion of the object to be processed, which is projected from the susceptor; and the film formation preventing gas supplying means have a ring-shaped member constituting a passage through which the film formation preventing gas flows toward the peripheral edge of the object to be processed on a side of the first surface in the projected portion of the object to be processed. As a result of this structure, when the object to be processed is mounted on the susceptor such that the peripheral portion thereof is projected from the susceptor, a passage is formed so that the film formation preventing gas flows to the peripheral edge of the object through the rear surface of the projected portion of the object. Thus, the film formation preventing gas effectively prevents the process gas from flowing to the rear surface of the object to be processed.

It is preferable that the ring-shaped member has an inner flange portion on an inner circumferential surface thereof, the inner flange portion having a surface opposing with a predetermined gap to the first surface of the object to be processed mounted on the susceptor in the projected portion, thus defining a first part of the passage between the surface of the inner flange portion and the first surface of the object to be processed. It is also preferable that, where the first portion of the passage has a length L (m), a process gas has a diffusion constant D ($m^2$/s) and the film formation preventing gas flows at a flow rate v (m/s), the length L and the flow rate v are set to satisfy a condition of Lv/D>1. Thus, the film formation preventing gas effectively prevents the process gas from flowing to the rear surface of the object to be processed.

The ring-shaped member is preferably made of non-metallic material. In this case, since non-metallic material has a lower thermal conductivity than metal, thermal reaction on the ring-shaped member is suppressed. Consequently, film formation on the ring-shaped member can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently

DETAILED DESCRIPTION OF THE INVENTION

An embodiment of the present invention will be described with reference to the accompanying drawings.

Figure 1:
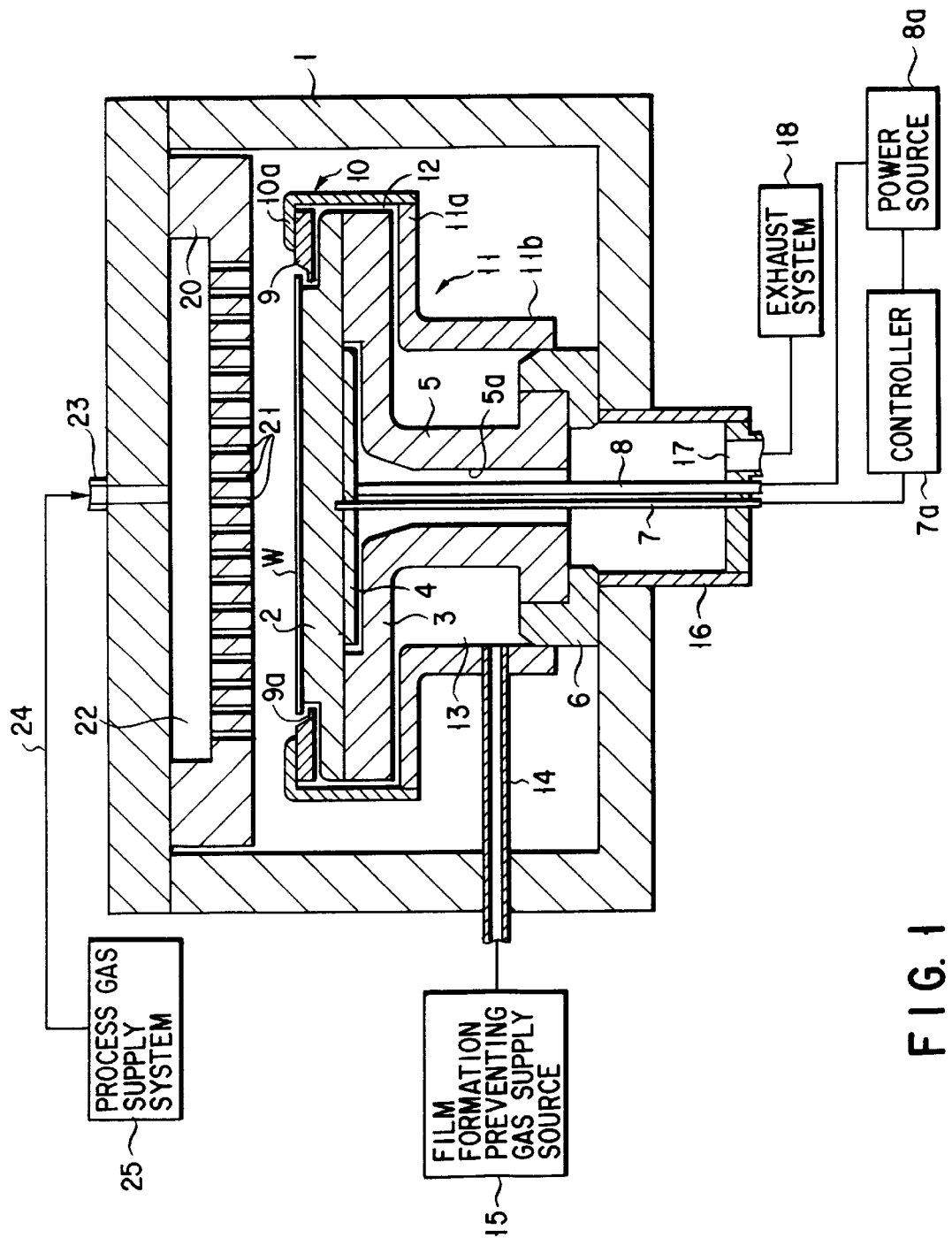
FIG. 1 is a cross-sectional view showing a CVD film forming apparatus according to an embodiment of the present invention.

FIG. 1 is a cross-sectional view showing a CVD film forming apparatus according to an embodiment of the present invention. The film forming apparatus has a substantially cylindrical airtight chamber 1 made of metal, such as aluminum. In a central portion of the chamber 1, a base member 3 made of, for example, alumina, is mounted such that the upper surface thereof is horizontal. An electric heater 4 is embedded in a central portion of the upper surface portion of the base member 3. A susceptor 2 for horizontally supporting an object to be processed, e.g., a semiconductor wafer W, is placed on the upper surface of the base member 3. The susceptor 2 is made of, for example, alumina, and includes an electrostatic chuck on a main surface thereof to attract the semiconductor wafer W with static electricity. The electrostatic chuck has an area the substantially same as or smaller than that of the semiconductor wafer W, so that it can be covered by the wafer to prevent the top surface of the electrostatic chuck from being exposed within the chamber and a film may not be formed on the chuck. In this embodiment, the electrostatic chuck has a diameter smaller than that of the wafer. Thus, the circumferential edge of the wafer is entirely projected from the electrostatic chuck, and therefore from the susceptor.

The base member 3 comprises a large-diameter portion having a diameter substantially the same as that of the susceptor, and a cylindrical support member 5 having a smaller diameter integrally extending downward from a central portion of the large-diameter portion. The support member 5 is attached to the bottom of the chamber 1 at its lower end by a cylindrical attachment member 6, the circumferential wall of which has an L-shaped cross section. In the circumferential wall of the attachment member, a plurality of gas passage openings are arranged at intervals in the circumferential direction. Alternatively, the attachment member can be constituted by a plurality of attachment pieces, which are arranged at intervals in the circumferential direction, such that a gas passage is defined by adjacent pieces.

The support member 5 includes an internal space 5a extending in the vertical direction along the central axis thereof. A thermoelectric couple 7 having a temperature measuring portion in the susceptor 2 and an electric supply line 8 for supplying electricity to the heater 4 are inserted in the internal space 5a. The thermoelectric couple 7 and the electric supply line 8 extend out of the chamber and are respectively connected to a controller 7a and a power source 8a connected to the controller. With this structure, the thermoelectric couple 7 detects a temperature of the susceptor 2 and thus a temperature of the wafer W mounted thereon, and the controller 7a controls a voltage supplied from the power source 8a to the heater 4 in accordance with the detected temperature.

Figure 2:
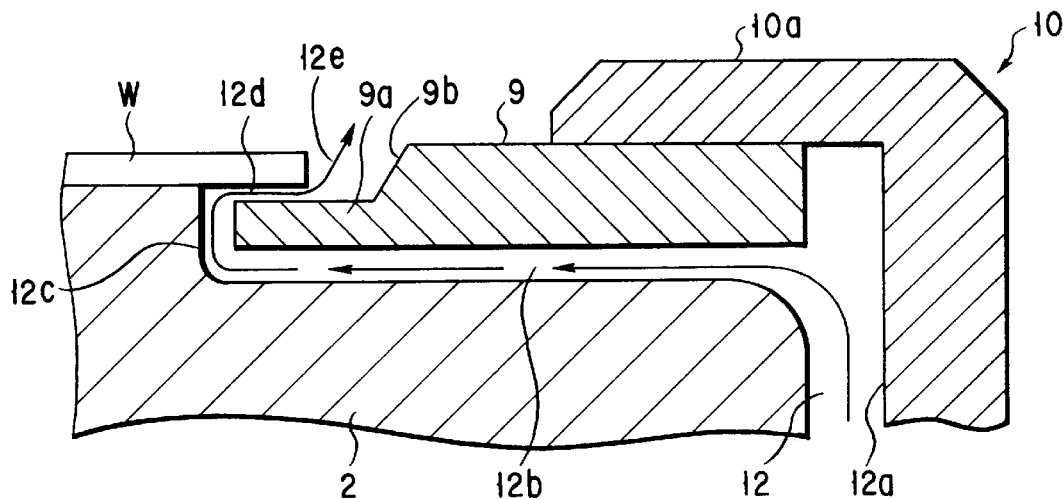
FIG. 2 is an enlarged cross-sectional view showing part of the CVD film forming apparatus shown in FIG. 1.

The susceptor 2 includes a lower circular portion having a comparatively large diameter and an upper circular portion having a slightly smaller diameter, thus forming a step portion on the circumferential surface. The semiconductor wafer W is placed on the upper portion of the susceptor 2. A shield ring or ring-shaped member 9 is arranged around the upper portion of the susceptor 2, spaced a little from the susceptor and the wafer W. The shield ring is made of nonmetallic material, such as alumina or zirconia. An inner flange portion 9a is integrally projected from an a inner circumferential surface of a lower portion of the shield ring 9. The shield ring 9 is arranged such that the inner flange portion is located between the under surface of a circumferential edge portion of the wafer and the upper surface of the lower portion of the susceptor and that the inner circumferential surface of an upper portion of the shield ring 9 is opposed to the circumferential surface of the wafer. It is preferable that a tapered portion 9b be formed in the inner circumferential surface of the upper portion of the shield ring 9, as shown in FIG. 2. The upper surface of the shield ring 9 is attached to a lower surface of an inner flange portion 10a of an upper shield tube 10, the circumferential wall of which has an L-shaped cross section. The inner circumferential surface of the shield tube 10 extends in the vertical direction with a very short distance to the outer circumferential surfaces of the shield ring 9 and the large-diameter portions of the susceptor 2 and the base member 3. A lower shield tube 11 is attached to an inner circumferential surface of a lower end portion of the upper shield tube 10, at its upper end. The lower shield tube 11 has a circumferential wall having an L-shaped cross section. It comprises an outer flange portion 11a having an upper surface which faces the lower surface of the base member 3 with a small gap. It also comprises a cylindrical portion 11b spaced a predetermined distance from the support member 5, defining a space 13 therebetween. The lower end portion of the cylindrical portion 11b is attached to the attachment portion 6. Thus, the upper and lower shield tubes 10 and 11 and the shield ring 9 are stationary fixed to the chamber 1.

A gas introducing pipe 14 for introducing a film formation preventing gas into the chamber is inserted into a portion of the cylindrical portion 11b of the lower shield tube 11. One end of the gas introducing pipe 14 is opened in the space 13. The gas introducing pipe 14 extends out of the chamber through the circumferential wall of the chamber 1 and is connected to a gas supply source 15 at the other end for supplying a film formation preventing gas, for example, Ar gas into the space 13. The film formation preventing gas supply source 15 has, for example, a mass flow controller, to select a desired flow rate and/or pressure of Ar gas supplied to the chamber. A first gap between the upper surface of the outer flange portion 11a of the lower shield tube 11 and the lower surface of the large-diameter portion of the base member 3 is continuous to a second gap between the inner circumferential surface of the upper shield tube 10 and the outer circumferential surfaces of the large-diameter portion of the base member 3 and the lower portion of the susceptor 2. The second gap is continuous to a third gap between the upper surface of the lower portion of the susceptor 2 and the lower surface of the shield ring 9. The third gap is continuous to a fourth gap between the outer circumferential surface of the upper portion of the susceptor 2 and the inner circumferential surface of the inner flange portion 9a of the shield ring 9. The fourth gap is continuous to a fifth gap between the upper surface of the inner flange portion 9b and the lower surface of the extended peripheral end of the semiconductor wafer W. The fifth gap is continuous to a sixth gap between the circumferential surface of the wafer W and the tapered surface of the shield ring 9. The second to sixth gaps are identified by symbols 12a to 12e in FIG. 2. The first gap communicates with the space 13, and the sixth gap communicates with a process space within the chamber 1, thus constituting a film formation preventing gas passage 12 extending from the space 13 to the process space.

A cylindrical box 16 is attached to the bottom wall of the chamber 1. The upper end of the box 16 is covered by the bottom surface of the support member 5 and the lower end portion thereof is projected from the bottom wall. An exhaust port 17 is formed in a bottom wall of the box 16 and connected to an exhaust system 18. When a vacuum pump provided in the exhaust system 18 is operated, the pressure in the chamber 1 can be reduced to a predetermined degree through the box and the gas passage openings formed in the attachment member 6.

A shower head 20 is mounted to the upper wall of the chamber 1 so as to face the semiconductor wafer W placed on the susceptor 2 with a predetermined distance therebetween, such that the aforementioned process space can be defined. The shower head 20 has an inner space 22, and a lower wall which faces the semiconductor wafer 2 and has a number of gas outlet holes 21. A gas introducing port 23 is formed in a central portion of the upper wall of the chamber 1 to communicate with the space 22. The gas introducing port 23 is connected through a pipe 24 to a process gas supply system 25 for supplying a process gas containing a film forming gas (e.g., DMAH) for forming an Al film and a carrier gas (e.g., $H_2$ gas). The process gas is supplied from the process gas supply system 25 through the pipe 24 and the gas introducing port 23 to the inner space 22 of the shower head 20, and then discharged through the gas outlet holes 21 into the process space, i.e., toward the semiconductor wafer W.

In the above structure, as shown in FIG. 2, the film formation preventing gas passage 12 is constituted by the first gap continuous to the space 13, and the second to sixth gaps 12a to 12e continuous to one another in sequence. As shown in FIG. 2 in detail, the film formation preventing gas is passed through the first to sixth gaps or paths from the space 13, and flows from the rear surface of the projected portion of the semiconductor wafer W toward the circumferential surface thereof, as indicated by the arrow.

A film forming operation in the CVD film forming apparatus having the above structure will now be described.

First, a semiconductor wafer W is transferred into the chamber 1 by a transfer arm (not shown) and placed on the susceptor 2 which has been heated at a predetermined temperature by the heater 4. Then, the chamber 1 is exhausted by the vacuum pump of the exhaust system 18, so that the pressure of the chamber is reduced to about several Torrs and the semiconductor wafer W is drawn to the electrostatic chuck.

In this state, a process gas containing a film forming gas (e.g., DMAH) and a carrier gas (e.g., $H_2$ gas) is supplied from the process gas supply system 25 to the process space at a predetermined flow rate through the shower head 20, thus starting a process of forming an Al film.

At the same time as supplying the process gas, a film formation preventing gas or purge gas is supplied from the film formation preventing gas supply source 15 through the gas introducing pipe 14 to the space 13, and flows through the passage 12 from the rear surface of the projected portion of the semiconductor wafer W to the circumferential surface of the wafer. The flow rate of the film formation preventing gas is preset to such a value as to prevent the film forming gas from turning to the rear surface side of the wafer W. Therefore, the film formation gas does not turn to the rear surface side of the semiconductor wafer, so that film formation on the exposed portion of the rear surface can be prevented. For this reason, particles due to removal of a film formed on the rear surface of the semiconductor wafer W are not generated.

The shield ring 9 is made of nonmetallic material, such as alumina or zirconia, which generally has a lower thermal conductivity than metal. In addition, the shield ring 9 is separated by the passage 12 from the heated susceptor 2. Therefore, the temperature of the shield ring 9 is kept low, so that thermal reaction on the shield ring 9 is suppressed. Consequently, film formation on the shield ring 9 can be suppressed.

Conditions for prohibiting the process gas from turning to the rear surface side of the semiconductor wafer W by means of flow of a film formation preventing gas will be described on the basis of model calculations.

In the following, movement of the process gas due to diffusion and reverse movement of the process gas due to flow of the film formation preventing gas in the fifth gap 12b of the passage 12 will be described with reference to FIG. 3.

Figure 3:
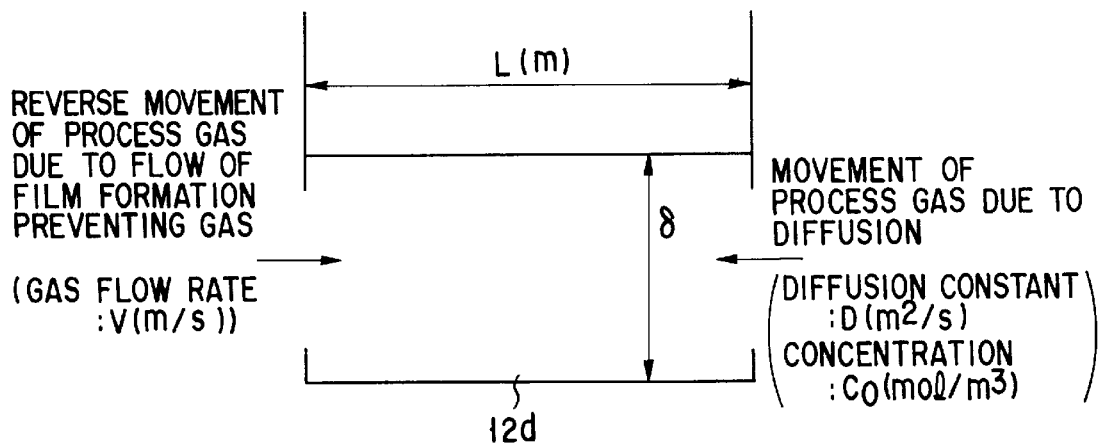
FIG. 3 is a diagram for explaining conditions for preventing a process gas from turning to the rear surface of a wafer by a film formation preventing gas.

Assuming that the path length (the length in the horizontal direction between the inner circumferential edge of the inner flange portion 9a and the circumferential edge of the semiconductor wafer) is L (m), the diffusion constant of the process gas is D ($m^2/S$), the concentration of the process gas is Co ($mol/m^3$), the number of moles of the process gas moved by diffusion in a unit area in a unit time from the right to the left in FIG. 3 is expressed by the following formula (1):

$$D \times (Co/L) \ [mol/m^2 \cdot s] \tag{1}$$

Assuming that the flow rate of the film formation preventing gas is v (m/s), the number of moles of the process gas moved by flow of the film formation preventing gas in a unit area in a unit time from the left to the right in FIG. 3 is expressed by the following formula (2):

$$v \cdot Co \ [mol/m^2 \cdot s] \tag{2}$$

If the value of the formula (2) is greater than that of the formula (1), the process gas can be prevented from turning to the rear exposed surface side of the semiconductor wafer W. As a result, film formation on the rear surface of the semiconductor wafer W can be effectively prevented. In other words, if the condition Lv/D>1, preferably Lv/D>>1, is satisfied, film can be effectively prevented from being formed on the rear surface of the projected portion of the semiconductor wafer W.

For example, it is assumed that the diameter d of the semiconductor wafer is 200 mm, the path length L is 1.5 mm, the width δ of the path (see FIG. 3) is 0.3 mm, the temperature of the atmosphere in the chamber is 210° C., the pressure is 2 Torr, DMAH serving as a film forming gas is supplied at the flow rate of 1000 sccm and $H_2$ gas serving as a carrier gas is supplied at the flow rate of 100 sccm.

In this case, it is assumed that a film formation preventing gas (Ar gas) is caused to flow at the rate of 1000 sccm. This flow rate is converted to a volume flow rate Qa ($m^3/s$) at 210° C. and 2 Torr as follows.

$$Qa(m^3/s)=\{(1000\times10^{-6})/60\}\times\{(273+210)/273\}\times(760/2)=11.2\times10^{-3}(m^3/s)$$

A jetting area $A(m^2)$ of the film formation preventing gas is obtained by the following equation.

$$A(m^2)=\pi\times d\times\delta=\pi\times200\times10^{-3}\times0.3\times10^{-3}=188\times10^{-6}(m^2)$$

Therefore, the flow rate v of the film formation preventing gas is obtained by the following equation.

$$V=Qa/A=59.6(m/s)$$

The diffusion constant of a mixture gas of DMAH of the flow rate of 1000 sccm and $H_2$ gas of the flow rate of 100 sccm under the conditions of 210° C. and 2 Torr is D=0.028 $(m^2/s)$. In this case, the value of Lv/D is calculated as follows.

$$Lv/D=(1.5\times10^{-3}\times59.6)/0.028=3.19$$

Since the value is sufficiently greater than 1, it is confirmed that film formation on the rear surface of the projected portion of the semiconductor wafer W can be prevented by the film formation preventing gas of the flow rate of 1000 sccm under the aforementioned conditions.

The diffusion constant D is a function of a molecular weight of gas, a diameter of a molecule, a pressure and a temperature. The constant D is calculated each time on the basis of the kind of gas, the process pressure, and the temperature.

The present invention is not limited to the above embodiment, but can be modified variously. For example, although Ar gas is used as a film formation preventing gas or purge gas in the above embodiment, it is possible to use another inert gas, such as He or $N_2$ gas, or a reducing gas such as $H_2$ gas. Alternatively, it is possible to use a process gas of a temperature at which a film is not formed, for example, the room temperature or lower. Further, the process gas is not limited to that used in the above embodiment, but various kinds of gas can be used in accordance with the kind of film to be formed. Although the susceptor of the above embodiment has an electrostatic chuck, it is not necessary that the susceptor have an electrostatic chuck. Furthermore, the embodiment wherein an Al film is formed has been described, the present invention can be applied to formation of another film. Further, the object to be processed is not limited to a semiconductor wafer, but can be a glass substrate of a liquid crystal display.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A CVD film forming method, wherein an object to be processed is mounted on a susceptor provided in a process chamber and a process gas is supplied to a main surface of the object to be processed, thereby forming a film on the object to be processed, said method comprising a step of supplying film formation preventing gas in a direction from a rear surface of the object to be processed toward a peripheral edge thereof, the film formation preventing gas having a flow rate which prevents the process gas from flowing to the rear surface of the object to be processed at the peripheral edge of the object to be processed, wherein the object to be processed is mounted on the susceptor so as to have a projected portion, in the peripheral portion of the object to be processed, which is projected from the susceptor, and a passage through which the film formation preventing gas flows toward the peripheral edge of the object to be processed is formed between a ring-shaped member and the object to be processed from a rear surface of the projected portion of the object to be processed, wherein, the ring-shaped member has an inner flange portion on an inner circumferential surface thereof, the inner flange portion having a surface opposing with a predetermined gap to the rear surface of the object to be processed mounted on the susceptor in the projected portion, thus defining a first part of the passage between the surface of the inner flange portion and the rear surface of the object to be processed, and where a length of the first part of the passage is represented by L (m), a diffusion constant of the process gas is D $(m^2/s)$ and a flow rate of the film formation preventing gas is represented by v (m/s), and the length L and the flow rate v are set to satisfy a condition of Lv/D>1.

2. The CVD film forming method according to claim 1, wherein the inner circumferential surface of the ring-shaped member includes a tapered portion opposing with a predetermined gap to the peripheral portion of the object to be processed, and a second part of the passage is defined between the peripheral portion and the tapered portion.

3. The CVD film forming method according to claim 1, comprising providing a non-metallic ring-shaped member and arranging the non-metallic ring-shaped member apart from the susceptor.

4. The CVD film forming method according to claim 1, comprising attracting the object to be processed by means of an electrostatic force using an electrostatic chuck.

5. The CVD film forming method according to claim 1, comprising supplying as said film formation preventing gas at least one of an inert gas, a reduction gas and a process gas.

* * * * *